United States Patent [19]
Simizu

[11] Patent Number: 6,008,498
[45] Date of Patent: Dec. 28, 1999

[54] CHARGED PARTICLE BEAM APPARATUS AND METHOD OF USING THE SAME

[75] Inventor: Hiroyasu Simizu, Kawasaki, Japan

[73] Assignee: Nikon Corporation, Tokyo, Japan

[21] Appl. No.: 08/940,741

[22] Filed: Sep. 30, 1997

[30] Foreign Application Priority Data

Sep. 30, 1996 [JP] Japan .................................. 8-258729

[51] Int. Cl.$^6$ ........................ H01J 37/302; H01J 37/153
[52] U.S. Cl. ............................. 250/492.22; 250/492.23; 250/396 ML
[58] Field of Search ...................... 250/396 ML, 492.22, 250/492.23

[56] References Cited

U.S. PATENT DOCUMENTS

| 4,400,622 | 8/1983 | Takeuchi et al. | 250/396 ML |
| 4,544,847 | 10/1985 | Taylor | 250/396 ML |

FOREIGN PATENT DOCUMENTS

| 6-216016 | 8/1994 | Japan . |
| 7-45493 | 2/1995 | Japan . |

OTHER PUBLICATIONS

Lischke et al., "High Resolution Electron Lithography Aided By Micro Imaging, Part 2: Realization of a 1:4 Projector Including Experimental Findings," *Optik* 54:325–341 (1978) (in the German language, with an English Translation attached).

*Primary Examiner*—Jack I. Berman
*Attorney, Agent, or Firm*—Klarquist Sparkman Campbell Leigh & Whinston, LLP

[57] ABSTRACT

The imaging characteristics of focal-point position, image rotation, and magnification of a projection system of a charged-particle-beam image-transfer apparatus are corrected by correction lenses positioned between a first projection lens and a second projection lens. The driving currents of the correction lenses are determined by solving a system of three linear equations with three unknowns, whose coefficients are the correction amounts for the three imaging characteristics of the projection system produced by the three correction lenses when they are driven by the unit Ampere-turn, and the target correction amounts for the three imaging characteristics. More correction lenses can be employed than imaging characteristics to be corrected, with Ampere-turn values selected from among those that satisfy the corresponding equations. Also, the driving currents of one or more projection lenses can be varied to allow the projection lenses to operate as correction lenses. Also, three correction lenses can be provided for each of three characteristics to be corrected. The correction for each characteristic can be performed individually, so as to avoid substantial change in the other two characteristics, and this may be done iteratively to approach the ideal correction.

21 Claims, 3 Drawing Sheets

CHARGED PARTICLE BEAM APPARATUS AND METHOD OF USING THE SAME

FIELD OF THE INVENTION

The present invention relates to charged-particle beam (CPB) apparatus used, for example, in microlithography processes for manufacturing semiconductor integrated circuits and the like. For example, in the transfer of a pattern from a mask or reticle to a sensitive substrate, by means of a projection system employing CPB illumination, the present invention provides a CPB image-transfer and exposure apparatus capable of correcting imaging characteristics of the projection system of the apparatus.

BACKGROUND OF THE INVENTION

Charged-particle-beam (CPB) image-transfer and exposure apparatus, such as electron-beam reduction image-transfer devices and the like, have recently been developed. CPB image-transfer and exposure apparatus provide improved productivity and resolution of transferred patterns relative to light-based image-transfer and exposure devices.

It is desirable that CPB image-transfer devices have as large an optical field as possible, that is, the pattern area that can be transferred at once as a whole via the projection system of the device should be as large as possible. But, when the optical field of such a projection system is enlarged, it becomes difficult to keep imaging characteristics (such as focal-point position, image rotation, magnification, and the like) within prescribed permissible ranges over the entire optical field. For this reason, correction lenses are typically included in such a projection system for the purpose of correcting the imaging characteristics.

FIG. 1 illustrates a prior-art electron-beam image-transfer device (electron-beam exposure apparatus) equipped with correction lenses for the projection system. In FIG. 1, an electron beam EB passes through a pattern field on a reticle 3. Although not shown in FIG. 1, the electron beam EB upstream of the reticle 3 is emitted from an illumination system comprising an electron beam source, an illumination lens, a deflector controlling the illumination field of the electron beam, and astigmatism-correction device. After passing through the reticle, the electron beam EB forms an image of a reticle pattern on a wafer 10 or other substrate via a projection system P comprising a first projection lens 7 and a second projection lens 8. Positioned between the first projection lens 7 and the second projection lens 8 are a first rotation-correction lens 31 and a second rotation-correction lens 32.

The projection lenses 7 and 8 are electromagnetic lenses. The projection lenses 7 and 8 rotate the pattern image as it is transferred to the wafer 10, due to the rotational effects of the magnetic field produced by the projection lenses. The projection lenses 7 and 8 are typically designed to rotate the image so that the orientation of the image on the wafer 10 will coincide with a prescribed orientation.

In practice, the image rotation frequently does not exactly meet specification due to design error in the projection lenses 7 and 8, manufacturing error, height error of the stage on which the wafer 10 is supported, and the like. The exact image rotation thus must be controlled by the two rotation-correction lenses 31 and 32.

Image rotation is known to be generally proportional to the integral value of the on-axis magnetic field. For this reason, the sum of the integral value of the on-axis magnetic field of the first rotation-correction lens 31 and that of the second rotation-correction lens 32 is proportional to the correction of image rotation.

One difficulty with correction of image rotation is that the focal-point position of the image changes significantly when the magnetic fields of the rotation-correction lenses 31, 32 are aligned, even though a large image rotation can be achieved with such alignment. Hence, the rotation-correction lenses 31, 32 are typically driven with currents, the directions of which are chosen such that the generated magnetic fields are in opposite directions, in order to reduce the change in the focal-point position.

The two rotation-correction lenses 31, 32 are typically positioned so as to correct the image rotation of the image and so as to set the magnetic fields of the two rotation-correction lenses 31, 32 in opposite directions. As a result, the focal-point position of the image is not displaced significantly by the rotation-correction lenses 31, 32. But, when the image rotation is corrected while minimizing any change of the focal-point position by setting the magnetic fields of the two rotation-correction lenses 31, 32 in opposite directions, the magnification of the transferred image is adversely affected. And, when the two rotation-correction lenses 31, 32 are driven so as to eliminate adverse changes in magnification, the focal-point position of the image is displaced significantly.

Independently employing an image-rotation-correction lens and a focal-point position-correction lens has been proposed for the purpose of correcting the image rotation and the focal-point position, respectively. With such a scheme, the focal-point displacement generated by the image-rotation-correction lens can be adjusted by using the focal-point-correction lens. But, with such a scheme, image rotation changes whenever the focal-point-correction lens is employed. This makes it difficult to keep the imaging characteristics as a whole within a prescribed permissible range.

SUMMARY OF THE INVENTION

In view of the foregoing, an object of the present invention is to provide charged-particle-beam (CPB) image-transfer apparatus capable of accurately and easily setting the imaging characteristics of a projection system within a suitable range. Another object of the present invention is to provide methods of using such a CPB image-transfer apparatus.

In order to achieve these objects, the CPB image-transfer apparatus of the present invention comprises multiple correction lenses (e.g., three correction lenses) each employed to correct several imaging characteristics of the projection system of the CPB image-transfer apparatus. The correction lenses are preferably electromagnetic lenses.

The CPB image-transfer apparatus guides a charged particle beam to a substrate by means of a projection system including at least two projection lenses, and corrects the imaging characteristics of the projection system via the correction lenses.

According to the present invention, in order to correct two imaging characteristics (the focal-point position and the image rotation, for example), a first correction lens and a second correction lens are employed, each correcting both of the imaging characteristics to some degree, instead of employing two independently operating lenses, one for each imaging characteristic. By operating the first and the second correction lenses in parallel, both imaging characteristics (such as focal-point position and image rotation) can be simultaneously corrected. In this way, the desired imaging performance can be easily and accurately achieved.

DETAILED DESCRIPTION

General Considerations

According to one embodiment of the present invention, the driving current of each of multiple correction lenses (e.g., lenses 9A, 9B, 9C shown in FIG. 2) is determined from the target corrections for the imaging characteristics of the projection system P to be corrected, together with the change in those imaging characteristics produced, per unit driving current, by each of the correction lenses 9A, 9B, 9C.

If, for example, the number of the imaging characteristics to be corrected is M (where M is an integer greater than 2), and the number of correction lenses N is set equal to M, and the contribution of each of the correction lenses to the entire amount of change in the imaging characteristics is approximately linear, then the driving current of each of the N correction lenses can be uniquely and easily determined by solving N linear equations with N unknowns.

According to a second embodiment, for the purpose of correcting the M imaging characteristics, N correction lenses are used where N>M. In this case, the driving current of each of the correction lenses cannot be uniquely determined and N−M degrees of indeterminacy remain. However, there are N−M degrees of freedom to control the M imaging characteristics.

The second embodiment is obtained by providing N electromagnetic lenses (where N is an integer greater than M, preferably greater than 3) as correction lenses and preferably selecting focal-point position, image rotation, and magnification as the three imaging characteristics to be corrected (with optional additional characteristics up to a total of N−M).

In the following methods, for calculation of driving currents for the correction lenses, the optical axis of the projection system may be represented by the z-axis, and an orthogonal coordinate system of a plane perpendicular to the z-axis may be represented by the x-axis and the y-axis. The complex coordinate corresponding to (x, y) in the xy-coordinate system may be represented by (x+iy) where i is the complex unit, the complex-conjugate coordinate of (x+iy) may be represented by (x−iy), the derivative $dw[z]/dz$ of an arbitrary complex-valued function $w[z]$ with respect to the variable z may be represented by $w'[z]$, the z-coordinate of an object point may be represented by $zo$, the z-coordinate of an image point may be represented by $zi$, the on-axis magnetic field of the projection system under uncorrected imaging conditions may be represented by $B[z]$, and the on-axis electric potential distribution may be represented by $\Phi[z]$.

Figure 3:
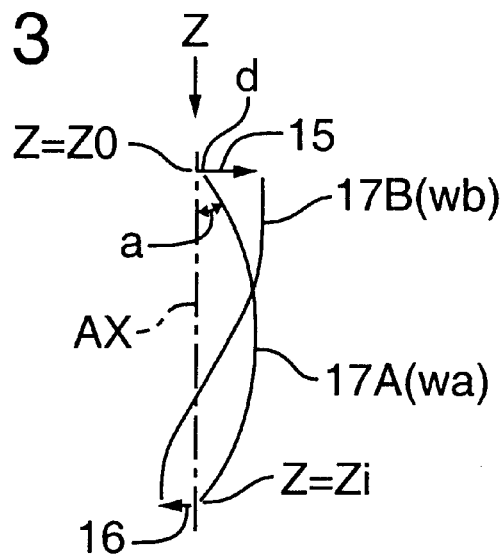
FIG. 3 is a diagram illustrating two paraxial electron-beam orbits (trajectories) generated by the projection system P of the apparatus of FIG. 2.

The complex coordinates $wa[z]$ and $wb[z]$ of two paraxial orbits (trajectories) can be determined so that they satisfy $wa[zo]=0$, $wa'[zo]=1$, $wb[zo]=1$, $$Re(wb'[zo])=0, \text{ and } Im(wb'[zo])=(0.5(e/2\ m)^{0.5})\cdot(B[zo]/\Phi[zo]^{0.5}),$$

where Re(w) represents the real part of a complex number w, and Im(w) represents the imaginary part of a complex number w. In this case, as shown in FIG. 3, if an image 16 (whose z-coordinate is $zi$) of a pattern 15 (whose z-coordinate is $zo$) is formed by the projection system, then the paraxial orbit represented by the complex coordinate $wa[z]$ corresponds to a ray orbit 17A along which a ray is emitted at the object point on the optical axis AX at the unit inclination angle a (a=1 in FIG. 3) and reaches the image point on the optical axis AX. The paraxial trajectory represented by the complex coordinate $wb[z]$ corresponds to a trajectory 17B along which a ray is emitted at the object point displaced from the optical axis AX by the unit distance d (d=1 in FIG. 3) and reaches the image point displaced from the optical axis AX. By correcting lens performance using these two trajectories, an image of a prescribed size can be transferred with a high degree of accuracy.

If the complex conjugate coordinate of the complex coordinate $wa[z]$ is denoted by $wac[z]$, and the amount of change in the on-axis magnetic field distribution when the nth (for n=1 through N) electromagnetic lens is excited by the unit Ampere-turn is denoted by $dbn[z]$, then, based on the following equations (1), (2), and (3), the correction amount for the focal-point-position correction $dzin$ by the nth correction lens, the correction amount $drn$ for the image rotation correction by the nth correction lens, and the correction amount $dMn$ for the magnification correction by the nth correction lens can be found respectively from the equations (1), (2) and (3), below.

$$dzin = \frac{e \cdot wb[zi]}{4 \cdot m \cdot wa'[zi] \cdot \sqrt{\Phi[zo]}} \int_{zo}^{zi} \frac{b[z] \cdot dbn[z] \cdot wa[z] \cdot wac[z]}{\sqrt{\Phi[z]}} dz \quad (1)$$

$$drn = \frac{1}{2}\sqrt{\frac{e}{2 \cdot m}} \int_{zo}^{zi} \frac{dbn[z]}{\sqrt{\Phi[z]}} dz \quad (2)$$

$$dMn = -\frac{e}{4 \cdot m \cdot \sqrt{\Phi[zo]}} \int_{zo}^{zi} \frac{B[z] \cdot dbn[z] \cdot wac[z] \cdot wb[z]}{\sqrt{\Phi[z]}} dz \quad (3)$$

Furthermore, if the target correction amounts for focal-point position, image rotation, and magnification of the projection system are represented by $dzi$, $dr$, and $dM$, respectively, then, by employing the following equation (4), the Ampere-turns I1, I2, I3, IN of each of the N electromagnetic lenses can be selected.

$$\begin{bmatrix} dzi \\ dr \\ dM \end{bmatrix} = \begin{bmatrix} dzi1 & dzi2 & dzi3 & \ldots & dziN \\ dr1 & dr2 & dr3 & \ldots & drN \\ dM1 & dM2 & dM3 & \ldots & dMN \end{bmatrix} \begin{bmatrix} I1 \\ I2 \\ I3 \\ \vdots \\ IN \end{bmatrix} \quad (4)$$

The Ampere-turns of the N correction lenses can thus be selected by employing a system of three linear equations with N unknowns assuming that the contribution of each of the N correction lenses to the entire correction amount of the imaging characteristics is linear. When N is greater than the number of characteristics to be corrected, the values of the Ampere-turns I1 through IN are not uniquely determined, but are selected so as to satisfy the equations above. If the number of imaging characteristics to be corrected (M) and the number of correction lenses (N) are equal, then the values of Ampere-turns I1 through IN can be uniquely determined by solving the above equation (4).

The Ampere-turns I1 through I3 of the three correction lenses 9A–9C can be determined by solving the following equation when only the focal point position is corrected, without correcting image rotation and magnification.

$$\begin{bmatrix} dzi \\ 0 \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (5)$$

Equation (5) is obtained from equation (4) by setting dr (the target-correction amount for image rotation) and dM (the target-correction amount for magnification) equal to 0 and setting dzi (the target-correction amount for focal-point position) equal to some finite value. In other words, according to the present invention, by setting the expressions representing change to other characteristics to zero, the intended correction can be easily and accurately achieved, without substantially affecting the other characteristics.

This method can be applied iteratively to individually approach the ideal correction for each characteristic to be corrected. (Each new correction may be considered as a superposition of new correcting magnetic fields on the existing correcting magnetic fields.)

When image rotation is to be corrected individually, the Ampere-turns I1 through I3 of the three correction lenses 9A–9C are determined using the following equation (6), without correcting the focal point position and the magnification.

$$\begin{bmatrix} 0 \\ dr0 \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (6)$$

In this way, the image rotation dr can be easily and exclusively corrected.

When only magnification is to be corrected, the Ampere-turns I1 through I3 of three electromagnetic lenses are chosen using the following equation (7), without correcting the focal point position and the image rotation.

$$\begin{bmatrix} 0 \\ 0 \\ dM \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (7)$$

In this way, the magnification can be easily and exactly corrected.

Preferred Embodiments

A first embodiment of the present invention will be explained with reference to FIG. 2 and FIG. 3. This embodiment comprises a mechanism for correcting the imaging characteristics of the electron-beam reduction-transfer apparatus. The electron-beam reduction-transfer apparatus of this embodiment can be used as a transfer apparatus based on the so-called "partition transfer" method in which the pattern defined by a mask or reticle is divided into a plurality of small subfields, and sequentially transfers the patterns of the subfields onto a wafer or other substrate via a projection system as will explained below.

Figure 1:
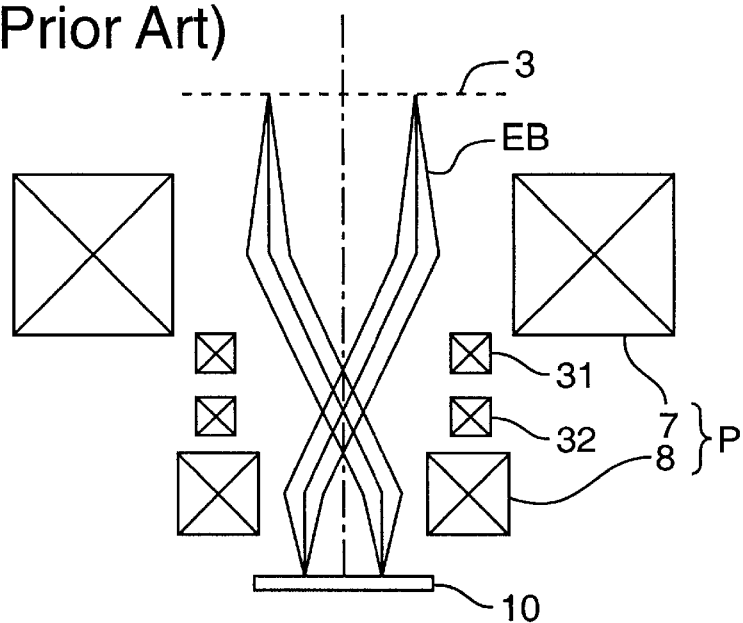
FIG. 1 is a schematic diagram of a prior-art electron-beam reduction pattern-transfer apparatus.
Figure 2:
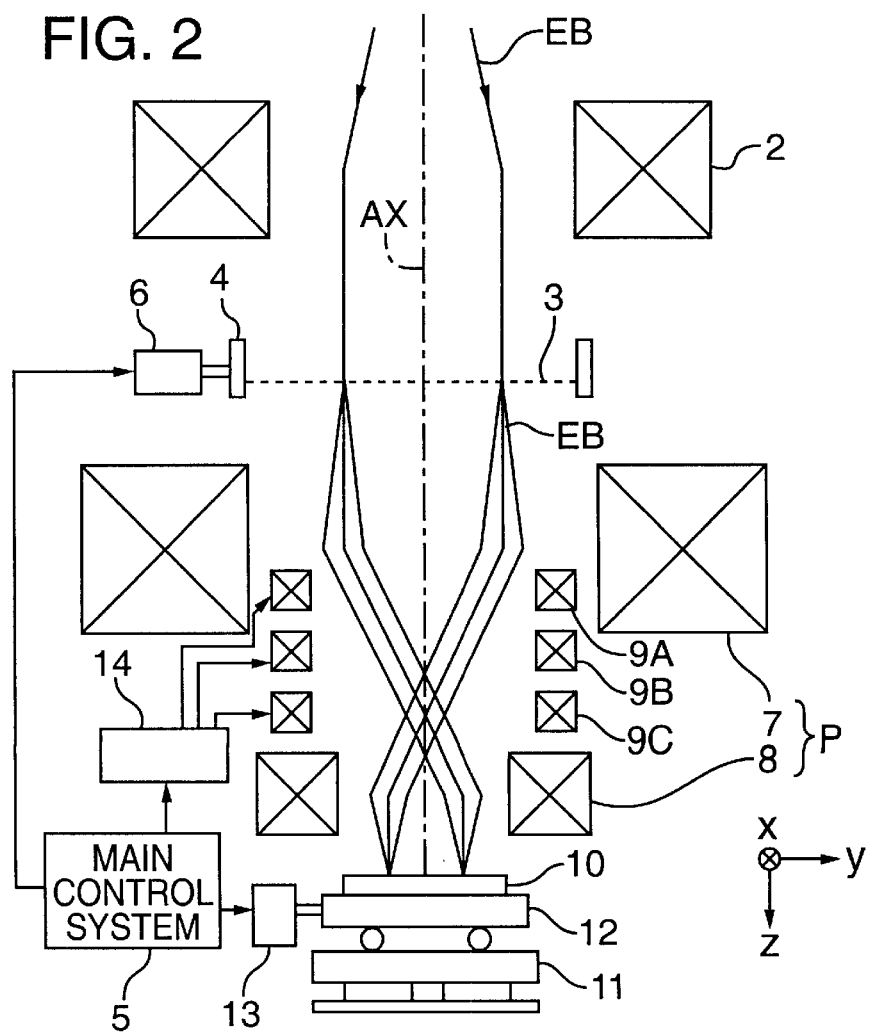
FIG. 2 is a schematic diagram of an embodiment of an electron-beam reduction pattern-transfer apparatus according to the present invention.

In FIG. 2, the z-axis is assumed to be parallel to the optical axis AX of the electron optical system, the x-axis to be on a plane perpendicular to the z-axis and the page, and the y-axis to be parallel to the plane of the page.

An electron beam EB emitted from an upstream electron gun (not shown) passes through an aperture plate, a deflector, and an astigmatism-correction device (all of which are not shown). The electron beam EB is transformed into a parallel beam by a condenser lens 2, and is guided to a reticle 3.

Note that when this transfer apparatus is used with the partition transfer method, the illumination field of the electron beam EB is a subfield on the reticle 3. In such an instance, a pair of subfield-selection deflectors (not shown) are positioned nearby above and below the condenser lens 2 for the purpose of selectively deflecting the electron beam EB onto successive subfields on the reticle.

The reticle 3 is secured parallel to the xy-plane on a reticle stage 4 that is freely movable in the x and y directions. The position of the reticle stage 4 on the xy-plane is detected by a laser interferometer (not shown). The detection signal produced by the interferometer is supplied to a main control system 5 that controls the overall operation of the apparatus. Based on the detected position of the reticle stage 4 on the xy-plane, the main control system 5 moves the reticle stage 4 via a driving device 6.

The electron beam that has passed through the reticle 3 forms a cross-over image via a first projection lens 7, and is condensed via a second projection lens 8 onto a wafer 10 coated with electron-beam resist material. An image of the pattern on the reticle 3, reduced by a prescribed demagnification ratio β, is thus transferred onto the wafer 10.

The first projection lens 7 and the second projection lens 8 comprise, for example, a projection system P based on the Symmetric Magnetic Doublet method.

Positioned between the first projection lens 7 and the second projection lens 8 along the optical axis AX are a first correction lens 9A, a second correction lens 9B, and a third correction lens 9C, each of which is preferably an electromagnetic lens. These three correction lenses 9A, 9B, 9C together correct the imaging characteristics of: (1) focal point position, (2) image rotation, and (3) magnification error of the projection system P to bring these imaging characteristics within a prescribed range. The driving currents corresponding to the target correction amounts to be produced in these imaging characteristics by the correction lenses 9A, 9B, 9C are set by the main control system 5 via a correction-amount-setting device 14.

The reticle 3 and the wafer 10 are synchronously scanned in the x-direction during exposure when the transfer apparatus is used with the "partition-transfer" method. On the reticle 3, in the partition-transfer method, finite boundary regions are disposed between each of the neighboring subfields. In contrast, the transfer subfields on the wafer 10 corresponding to the reticle subfields are tightly packed, with no space between neighboring transfer subfields. Hence, the electron beam is displaced by the width of the boundary region between reticle subfields. To provide this displacement correction of the wafer relative to the reticle 3, a deflector (not shown) is positioned between the reticle 3 and the wafer 10.

The wafer 10 is held parallel to the xy-plane on a wafer stage 12 above a sample platform 11. The wafer stage 12 is freely movable in the x and y directions. The position of the wafer stage 12 on the xy-plane is detected by a laser interferometer (not shown). The detection signal produced by the laser interferometer is supplied to the main control system 5. The main control system 5 moves the wafer stage 12, based on the detection signal, via a driving device 13. The main control system 5 moves the reticle stage 4 and the wafer stage 12 based on the exposure data supplied from an input device, and sets the relative position of the electron beam EB and the wafer 10 in a prescribed manner. Then, the main control system 5 illuminates the electron beam EB onto the reticle 3 so as to transfer the pattern image from the reticle 3 onto the wafer 10.

In this embodiment, any deviation $\Delta zi$ of the focal-point position, any deviation $\Delta r$ of the image rotation, and any deviation $\Delta M$ of the magnification from their respective target values (i.e., set values or actual measured values of the previous layer pattern) are pre-determined by calculation or measurement and are stored in a memory inside the main control system 5.

The main control system 5 calculates the driving currents of the correction lenses 9A, 9B, 9C to achieve the target correction amount for the focal point position ($\Delta zi$), the target correction amount for the image rotation ($\Delta r$), and the target correction amount for the magnification ($\Delta M$) in a manner to be explained below. Then, the main control system 5 provides the calculated driving currents to the correction lenses 9A, 9B, 9C via the correction-amount-setting device 14.

In this way, the main control system 5 corrects the imaging characteristics of the projection system P. As a result, the image characteristics of the projected image of the pattern on the reticle 3 match desired values. In other words, the imaging characteristics of the projection system P are accurately set to match the desired performance specifications, and the pattern image of the reticle 3 is transferred onto the wafer 10 at exactly the desired demagnification and at high resolution. The superposition error is also reduced, when the pattern image of the reticle 3 is superposed over another pattern already present on the wafer 10.

The complex conjugate coordinates of the complex coordinate wa[z] is denoted by wac[z], and the amount of change in the on-axis magnetic-field distribution when the three correction lenses 9A, 9B, and 9C are excited by the unit Ampere-turn are denoted by db1[z], db2[z], and db3[z], respectively. The changes in the focal point position dzi1, dzi2, and dzi3 caused when the correction lenses 9A, 9B, and 9C, respectively, are excited by the unit Ampere turn are calculated based on the following equations (8), (9), and (10), respectively. (The following series of equations (8) through (16) correspond to the case where the integer N is set equal to 3 in equation (1).)

$$dzi1 = -\frac{e \cdot wb[zi]}{4 \cdot m \cdot wa'[zi] \cdot \sqrt{\Phi[zo]}} \int_{zo}^{zi} \frac{B[z] \cdot db1[z] \cdot wa[z] \cdot wac[z]}{\sqrt{\Phi[z]}} dz \quad (8)$$

$$dzi2 = -\frac{e \cdot wb[zi]}{4 \cdot m \cdot wa'[zi] \cdot \sqrt{\Phi[zo]}} \int_{zo}^{zi} \frac{B[z] \cdot db2[z] \cdot wa[z] \cdot wac[z]}{\sqrt{\Phi[z]}} dz \quad (9)$$

$$dzi3 = -\frac{e \cdot wb[zi]}{4 \cdot m \cdot wa'[zi] \cdot \sqrt{\Phi[zo]}} \int_{zo}^{zi} \frac{B[z] \cdot db3[z] \cdot wa[z] \cdot wac[z]}{\sqrt{\Phi[z]}} dz \quad (10)$$

Next, the correction amounts dr1, dr2, and dr3 for the image rotations produced by the correction lenses 9A, 9B, and 9C, respectively, when the correction lenses 9A, 9B, and 9C are excited by the unit Ampere-turn are calculated using the following equations (11), (12), and (13).

$$dr1 = \frac{1}{2}\sqrt{\frac{e}{2 \cdot m}} \int_{zo}^{zi} \frac{db1[z]}{\sqrt{\Phi[z]}} dz \quad (11)$$

$$dr2 = \frac{1}{2}\sqrt{\frac{e}{2 \cdot m}} \int_{zo}^{zi} \frac{db2[z]}{\sqrt{\Phi[z]}} dz \quad (12)$$

$$dr3 = \frac{1}{2}\sqrt{\frac{e}{2 \cdot m}} \int_{zo}^{zi} \frac{db3[z]}{\sqrt{\Phi[z]}} dz \quad (13)$$

Similarly, the correction amounts dM1, dM2, and dM3 for the magnifications of the correction lenses 9A, 9B, and 9C, respectively, when the correction lenses 9A, 9B, and 9C are excited by the unit Ampere turn are calculated using the following equations (14), (15), and (16).

$$dM1 = \frac{e}{4 \cdot m \cdot \sqrt{\Phi[zo]}} \int_{zo}^{zi} \frac{B[z] \cdot db1[z] \cdot wac[z] \cdot wb[z]}{\sqrt{\Phi[z]}} dz \quad (14)$$

$$dM2 = \frac{e}{4 \cdot m \cdot \sqrt{\Phi[zo]}} \int_{zo}^{zi} \frac{B[z] \cdot db2[z] \cdot wac[z] \cdot wb[z]}{\sqrt{\Phi[z]}} dz \quad (15)$$

$$dM3 = \frac{e}{4 \cdot m \cdot \sqrt{\Phi[zo]}} \int_{zo}^{zi} \frac{B[z] \cdot db3[z] \cdot wac[z] \cdot wb[z]}{\sqrt{\Phi[z]}} dz \quad (16)$$

If the target correction amounts for focal-point position, image rotation, and magnification of the projection system P are represented by dzi, dr, and dM, respectively, and the following equation (17) is solved, then the Ampere-turns I1, I2, and I3 of the correction lenses 9A, 9B, and 9C, respectively, can be determined. This means that the driving currents of the three correction lenses 9A–9C can be determined by solving a system of three linear equations with three unknowns, assuming that the contribution of each of the three correction lenses 9A, 9B, 9C to the target correction amounts for the particular imaging characteristics at issue is approximately linear. (The following equation (17) is obtained from equation (4) by setting the integer N to 3.)

$$\begin{bmatrix} dzi \\ dr \\ dM \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (17)$$

In this case, the Ampere-turns I1, I2, I3 are uniquely determined since the number of correction lenses and the number of imaging characteristics are both three, provided that the determinant of the 3-by-3 matrix appearing in equation (17) is not zero. Also, since the number of coil-turns of the correction lenses 9A, 9B, 9C are predetermined, the main control system 5 determines the driving currents i1, i2, i3 of the correction lenses 9A, 9B, 9C, respectively, by dividing the Ampere-turns I1, I2, I3, respectively, by the corresponding number of coil-turns. The main control system 5 of FIG. 2 supplies the driving currents i1, i2, i3 which are determined in this way to the correction lenses 9A, 9B, 9C, respectively, via the correction-amount-setting device 14.

Depending on the characteristics of the projection system P, it may suffice to correct only the focal-point position without correcting the image rotation and the magnification. In this case, the Ampere-turns I1, I2, I3 of the correction lenses 9A, 9B, 9C, respectively, are determined by setting dr=0 and dM=0 in equation (17). This special case of equation (17) is given by the following equation (18).

$$\begin{bmatrix} dzi \\ 0 \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (18)$$

Similarly, dM and dzi may be set to 0 in equation (17) in order to correct the image rotation alone without correcting the magnification and the focal-point position of the projection system P, and the Ampere-turns I1, I2, and I3 may be determined. In this special case, equation (17) is given by the following equation (19).

$$\begin{bmatrix} 0 \\ dr \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (19)$$

Again similarly, dr and dzi may be set to 0 in equation (17) in order to correct the magnification alone, without correcting the image rotation and the focal-point position of the projection system P, and the Ampere-turns I1, I2, and I3 may be determined. In this special case, equation (17) is given by the following equation (20).

$$\begin{bmatrix} 0 \\ 0 \\ dM \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (20)$$

The following equation (21), which is obtained from equation (18) by setting dzi (the target correction amount for the focal-point position) equal to 1 (the unit correction amount) is solved first when the correction lenses 9A, 9B, 9C are used exclusively as a focal-point position-correction lens system (i.e, for the purpose of performing the focal-point correction alone), and then the ratio (excitation ratio) among the Ampere-turns I1 of the correction lens 9A, I2 of the correction lens 9B, and I3 of the correction lens 9C is determined.

$$\begin{bmatrix} 1 \\ 0 \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (21)$$

Given the foregoing, the focal-point position of the projection system P can be corrected by any amount by driving the correction lenses 9A, 9B, and 9C according to the ratio calculated among the Ampere-turns I1, I2, and I3 obtained from equation (21). In other words, if the Ampere-turns I1, I2, and I3 obtained from equation (21) are denoted by $I1_0$, $I2_0$, and $I3_0$, respectively, in order to correct the focal-point position dzi by an arbitrary amount, it suffices to set the Ampere-turns I1, I2, and I3 of the correction lenses 9A, 9B, and 9C, respectively, equal to $(dzi)(I1_0)$, $(dzi)(I2_0)$, and $(dzi)(I3_0)$, respectively.

Similarly, the correction lenses 9A, 9B, 9C are used exclusively as a rotation-correction lens system (i.e, for the purpose of correcting image rotation alone), the following equation (22) obtained from equation (19) is solved by setting dr (the target correction amount for image rotation) equal to 1 (the unit correction amount).

$$\begin{bmatrix} 0 \\ 1 \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (22)$$

Then, the excitation ratio among the Ampere-turns I1 of the correction lens 9A, I2 of the correction lens 9B, and I3 of the correction lens 9C is determined, and the driving currents of the correction lenses 9A, 9B, and 9C are set accordingly.

Again similarly, when the correction lenses 9A, 9B, 9C are used exclusively as a magnification-correction lens system (i.e, for the purpose of correcting the magnification alone), the following equation (23) obtained from equation (20) is solved by setting dM (the target correction amount for magnification) equal to 1 (the unit correction amount).

$$\begin{bmatrix} 0 \\ 0 \\ 1 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (23)$$

Then, the excitation ratio among the Ampere-turns I1 of the correction lens 9A, I2 of the correction lens 9B, and I3 of the correction lens 9C is determined, and the driving currents of the correction lenses 9A, 9B, 9C are set accordingly.

Figure 4:
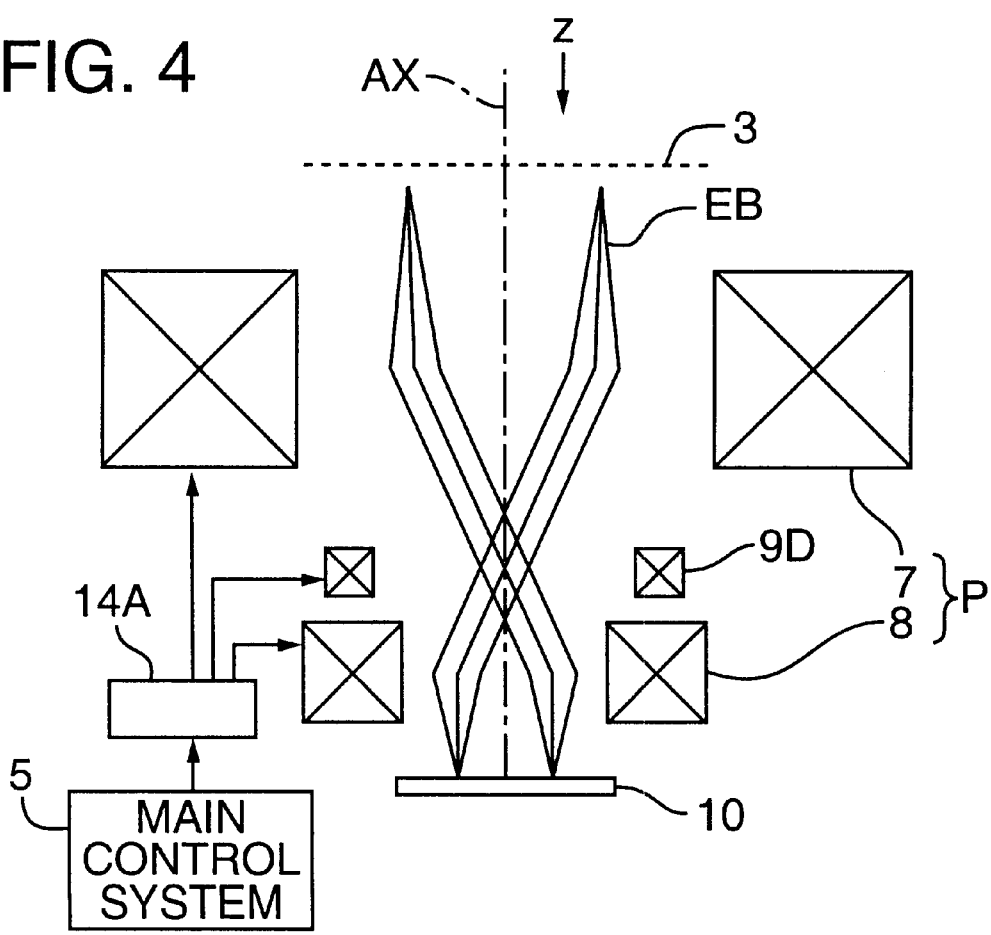
FIG. 4 is a schematic diagram of another embodiment of an electron-beam reduction pattern-transfer apparatus according to the present invention.

Another embodiment of the present invention will be explained with reference to FIG. 4. In this embodiment, one or more lenses of the projection system P serve as correction lenses. In FIG. 4, the same reference numerals are used for the same or corresponding parts described above with respect to FIG. 2. Also, the same illumination system and the same stage are used in the embodiment of FIG. 4 as in the embodiment of FIG. 2, but for simplicity are not shown FIG. 4.

In the embodiment shown in FIG. 4, an electron beam EB that has passed through a reticle 3 is condensed on a wafer 10 via a first projection lens 7 and a second projection lens 8. Thus, a reduced image of a pattern on the reticle 3 is transferred onto the wafer 10. Positioned between the first projection lens 7 and the second projection lens 8 is a correction lens 9D, which is preferably an electromagnetic lens. In this embodiment, the first projection lens 7 and the second projection lens 8 function also as the first correction lens 9A and the third correction lens 9C, respectively, of the embodiment described above with respect to FIG. 2. In other words, for example, when the imaging characteristics of the projection system P are corrected, the first projection lens 7 (or the second projection lens 8) is excited so as to generate a magnetic field equivalent to the sum of the designed magnetic field (the magnetic field of the lens before any correction) and the correction magnetic field of the correction lens 9A (or 9C) as described above.

The driving current of the correction lens 9D is supplied from a correction-amount-setting device 14A. The correction driving currents for the regular driving currents of the projection lenses 7 and 8 are also supplied from the correction-amount-setting device 14A. For this embodiment, the target correction amounts for the focal-point position, the image rotation, and the magnification may again be denoted by dzi, dr, and dM, respectively.

The main control system 5 determines the correction Ampere-turns I1 and I3 for the projection lenses 7 and 8, respectively, and the Ampere-turns I2 for the correction lens 9D, by employing calculations based on equations (8) through (17) above, and supplies the driving currents corresponding to the calculated Ampere-turns to the corresponding lenses via the correction-amount-setting device 14A. In this way, the imaging characteristics of the projection system P are set to provide desired imaging performance.

In this embodiment, the structure of the electron optical system is simplified since in the projection system P, the first projection lens 7 and the second projection lens 8 function not only as projection lenses but also as the first correction lens 9A and the third correction lens 9C (of the embodiment illustrated in FIG. 2), respectively.

Figure 5:
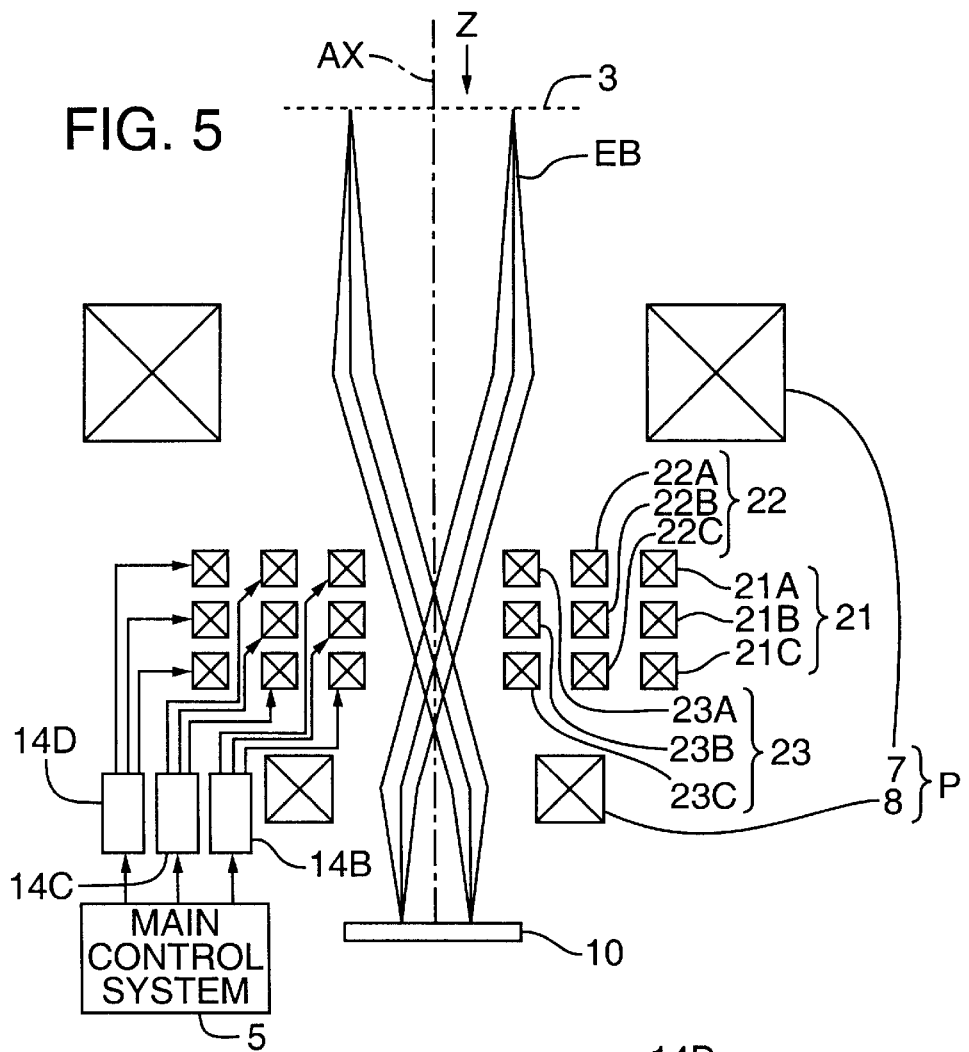
FIG. 5 is a schematic diagram of yet another embodiment of an electron-beam reduction pattern-transfer apparatus according to the present invention.

Another embodiment of the present invention will be explained with reference to FIG. 5. In this embodiment, three sets of correction lenses are used, each set comprising three correction lenses. In FIG. 5, the same reference numerals are used for corresponding features shown in FIG. 2. The same illumination system and stage system are used as in the embodiment of FIG. 2, but are not shown in FIG. 5 for simplicity.

In the embodiment shown in FIG. 5, an electron beam EB that has passed through a reticle 3 is condensed on a wafer 10 via a first projection lens 7 and a second projection lens 8. Thus, a reduced image of a pattern on the reticle 3 is transferred onto the wafer 10. Arranged concentrically (relative to the axis AX) between the first projection lens 7 and the second projection lens 8 are (1) a focal-point-correction lens system 23 that corrects only the focal-point position, (2) a rotation-correction lens system 22 that corrects only the image rotation, and (3) a magnification-correction lens system 21 that corrects only the magnification of the projection system P.

The focal-point-correction lens system 23 comprises a first focal-point-correction lens 23A, a second focal-point-correction lens 23B, and a third focal-point-correction lens 23C positioned near the optical axis AX. The rotation-correction lens system 22 comprises a first rotation-correction lens 22A, a second rotation-correction lens 22B, and a third rotation-correction lens 22C positioned concentrically around the lenses 23A–23C. The magnification-correction lens system 21 comprises a first magnification-correction lens 21A, a second magnification-correction lens 21B, and a third magnification-correction lens 21C positioned concentrically around the lenses 22A–22C.

The driving current of each of the correction lenses of the focal-point-correction lens system 23 is supplied from a focal-point position-setting device 14B. The driving current of each of the correction lenses of the rotation-correction lens system 22 is supplied from a rotation-correction-setting device 14C. The driving current of each of the correction lenses of the magnification-correction lens system 22 is supplied from a magnification-setting device 14D. Each of these driving currents is determined by the main control system 5, and is set by the focal-point-setting device 14B, the image-rotation-setting device 14C, and the magnification-setting device 14D, respectively.

An example of a method for determining the driving current for each of the correction lenses pertaining to the embodiment of FIG. 5 will now be given. As explained with respect to the embodiment of FIG. 2, the Ampere-turns (and corresponding driving currents) for each of the correction lenses of the focal-point-correction lens system 23 can be determined by solving equation (18) or equation (21). According to the present embodiment, the Ampere-turns will be determined as follows (in practically the same way as the above).

The on-axis magnetic fields of the first focal-point-correction lens 23A, the second focal-point-correction lens 23B, and the third focal-point-correction lens 23C, when excited by the unit Ampere-turn, may be represented by db11[z], db12[z], and db13[z], respectively. Similarly, the on-axis magnetic fields of the first rotation-correction lens 22A, the second rotation-correction lens 22B, and the third rotation-correction lens 22C, when they are excited by the unit Ampere-turn, may be represented by db21[z], db22[z], and db23[z], respectively. Again, the on-axis magnetic fields of the first magnification-correction lens 21A, the second magnification-correction lens 21B, and the third magnification-correction lens 21C, when they are excited by the unit Ampere-turn, may be represented by db31[z], db32[z], and db33[z], respectively. The magnetic fields of these correction lenses may thus be represented by dbmn (where m=1,2,3 and n=1,2,3).

The on-axis magnetic field and the on-axis electric potential of the projection system P under uncorrected conditions may be represented by B[z] and $\Phi[z]$, respectively, as in FIG. 2. The definitions of the complex coordinates wa[z] and wb[z], which represent the two paraxial orbits (trajectories) are assumed to be the same as in the embodiment of FIG. 2. In the present embodiment, where the correction lens whose on-axis magnetic field is dbmn is excited by the unit Ampere-turn, the correction amount dzimn for the focal-point position, the correction amount drmn for the image rotation, and the correction amount dMmn for the magnification are calculated using the following equations (24), (25) and (26).

$$dzimn = -\frac{e \cdot wb[zi]}{4 \cdot m \cdot wa'[zi] \cdot \sqrt{\Phi[zo]}} \int_{zo}^{zi} \frac{B[z] \cdot dbmn[z] \cdot wa[z] \cdot wac[z]}{\sqrt{\Phi[z]}} dz \quad (24)$$

$$drmn = \frac{1}{2}\sqrt{\frac{e}{2 \cdot m}} \int_{zo}^{zi} \frac{dbmn[z]}{\sqrt{\Phi[z]}} dz \quad (25)$$

$$dMmn = -\frac{e \cdot wb[zi]}{4 \cdot m \cdot \sqrt{\Phi[zo]}} \int_{zo}^{zi} \frac{B[z] \cdot dbmn[z] \cdot wac[z] \cdot wb[z]}{\sqrt{\Phi[z]}} dz \quad (26)$$

Next, the ratio (I11:I12:I13) among the Ampere-turns I11, I12, and I13 of the three focal-point position-correction lenses 23A, 23B, and 23C, respectively, will be determined by using the obtained correction amounts dzimn, drmn, and dMmn, and the following equation (27).

$$\begin{bmatrix} 1 \\ 0 \\ 0 \end{bmatrix} = \begin{bmatrix} dzi11 & dzi12 & dzi13 \\ dr11 & dr12 & dr13 \\ dM11 & dM12 & dM13 \end{bmatrix} \begin{bmatrix} I11 \\ I12 \\ I13 \end{bmatrix} \quad (27)$$

Once the ratio is determined, in order to correct the focal-point position by an arbitrary amount, the currents corresponding to the Ampere-turns obtained by multiplying the Ampere-turn ratios by dzi are supplied to the corresponding focal-point-correction lenses 23A, 23B, and 23C.

Similarly, the ratio (I21:I22:I23) among the Ampere-turns I21, I22, and I23 of the three rotation-correction lenses 22A, 22B, and 22C, respectively, can be determined by solving the following equation (28).

$$\begin{bmatrix} 0 \\ 1 \\ 0 \end{bmatrix} = \begin{bmatrix} dzi21 & dzi22 & dzi23 \\ dr21 & dr22 & dr23 \\ dM21 & dM22 & dM23 \end{bmatrix} \begin{bmatrix} I21 \\ I22 \\ I23 \end{bmatrix} \quad (28)$$

Again similarly, the ratio (I31:I32:I33) among the Ampere-turns I31, I32, and I33 of the three magnification-correction lenses 21A, 21B, and 21C, respectively, can be determined by solving the following equation.

$$\begin{bmatrix} 0 \\ 0 \\ 1 \end{bmatrix} = \begin{bmatrix} dzi31 & dzi32 & dzi33 \\ dr31 & dr32 & dr33 \\ dM31 & dM32 & dM33 \end{bmatrix} \begin{bmatrix} I31 \\ I32 \\ I33 \end{bmatrix} \quad (29)$$

In this embodiment, as an example, three independent power sources can be employed, each supplying a driving current to each of the three magnification-correction lenses 21A, 21B, 21C. However, alternatively, as shown in FIG. 6, in order to simplify the electric circuit, a single power source can be used to supply currents corresponding to the Ampere-turn ratios determined by equation (23) to the magnification-correction lenses 21A, 21B, and 21C.

Figure 6:
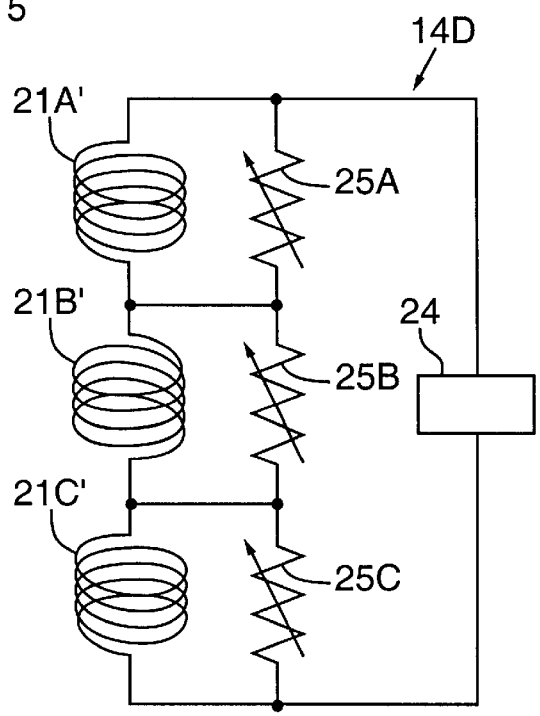
FIG. 6 illustrates the structure of one example of a magnification-setting device employable in the embodiment of FIG. 5.

FIG. 6 shows an example of the magnification-setting device 14D of FIG. 5. In this example, a coil 21A' of the first magnification-correction lens 21A, a coil 21B' of the second magnification-correction lens 21B, and a coil 21C' of the third magnification-correction lens 21C are serially connected. Variable resistors 25A, 25B, 25C are parallel-connected to the coils 21A', 21B', 21C', respectively. A constant-current power source 24 is connected between the upper end of the coil 21A' and the lower end of the coil 21C'.

In the example embodiment of FIG. 6, the ratio among the winding turns of the coils 21A', 21B' 21C', respectively, may be chosen to coincide approximately with the ratio among the Ampere-turns of the magnification-correction lenses 21A, 21B, 21C, respectively, as determined by equation (23). Then micro-control between the desired Ampere-turns ratio and the actual winding-number ratio among the coils 21A', 21B', 21C', respectively, is performed by controlling the resistance values of the variable resistors 25A, 25B, 25C, respectively.

In other words, in order to control the current flowing through the coil 21A', for example, it suffices to control the resistance value of the variable resistor 25A. In this way, the three magnification-correction lenses 21A, 21B, 21C can be driven to a prescribed Ampere-turns ratio using just one power source. A power source for the focal-point-correction lens system 23 and one for the rotation-correction lens system 22 can drive the corresponding associated three correction lenses in the same way.

In the above description of the various embodiments of the invention, it has been assumed that each of the correction lenses is manufactured exactly as the design specification. However, as with the projection-system lenses, the imaging characteristics of the correction lenses 9A, 9B, and 9C themselves may also deviate from the design specification to some extent. In such a case, when the correction lenses are operated together as described above to control only one of the imaging characteristics (i.e., only one of focal-point-displacement position, image rotation, and magnification), the other imaging characteristics change slightly also, producing a small correction error in the other imaging characteristics. As long as this correction error for the correction lenses 9A, 9B, 9C is smaller than the target correction amount, the desired imaging characteristics can be easily achieved, for example, by repeatedly correcting the other (inadvertently changed) imaging characteristics, until the ideal imaging conditions are approached to a sufficient degree.

According to the above-disclosed embodiments, of various imaging characteristics of the projection system P, only the focal-point position, the image rotation, and the magnification are corrected. However, other imaging characteristics such as astigmatism, distortion, and the like can also be corrected. Generally, when the number of correction parameters increases, the number of correction lenses must correspondingly be increased.

In addition, for example, in order to correct M (wherein M is an integer greater than or equal to 2) kinds of imaging characteristics, (M+1) or more correction lenses can be used. In this case, since the value of the current that flows through each of the correction lenses is not uniquely determined and some degrees of freedom remain, higher degrees of freedom for controlling the M kinds of imaging characteristics can be achieved.

Having illustrated and demonstrated the principles of the invention in the above-described embodiments, it should be apparent to those skilled in the art that the described embodiments can be modified in arrangement and detail without departing from such principles. For example, the principles of the present invention can be easily applied to ion-beam and other charged-particle imaging systems. I therefore claim as the invention all that comes within the scope of the following claims.

What is claimed is:

1. A method of correcting imaging characteristics of a projection system of a charged-particle-beam image-transfer apparatus for guiding a charged particle beam passing through a reticle onto a substrate coated with resist, the method comprising:

(a) providing at least three correction lenses, each of which receives a corresponding driving current and each of which changes at least three imaging characteristics of the projection system in response to changes in the driving current; and (b) driving each of the correction lenses with the corresponding driving current, with each driving current set so as to, in conjunction with each other driving current, simultaneously correct the at least three imaging characteristics of the projection system.

2. The method of claim 1, wherein the driving current for each of the correction lenses is determined from (1) an amount of change produced for each of the at least three imaging characteristics per unit driving current for each of the correction lenses, and (2) target correction amounts for each of the at least three imaging characteristics.

3. The method of claim 2, wherein:

the at least three correction lenses consists of N electromagnetic lenses, N being an integer greater than or equal to three;

the imaging characteristics include focal-point position, image rotation, and magnification of the projection system; and the correction amount dzin for the focal-point position, the correction amount drn for the image rotation, and the correction amount dMn for the magnification, produced by the nth electromagnetic lens, are calculated based on the following three equations, respectively $$dzin = -\frac{e \cdot wb[zi]}{4 \cdot m \cdot w'a[zi] \cdot \sqrt{\Phi[zo]}} \int_{zo}^{zi} \frac{B[z] \cdot dbn[z] \cdot wa[z] \cdot wac[z]}{\sqrt{\Phi[z]}} dz$$

$$drn = \frac{1}{2}\sqrt{\frac{e}{2 \cdot m}} \int_{zo}^{zi} \frac{dbn[z]}{\sqrt{\Phi[z]}} dz$$

$$dMn = -\frac{e}{4 \cdot m \cdot \sqrt{\Phi[zo]}} \int_{zo}^{zi} \frac{B[z] \cdot dbn[z] \cdot wac[z] \cdot wb[z]}{\sqrt{\Phi[z]}} dz$$

and Ampere-turns I1, I2, through IN of the N electromagnetic lenses satisfy the following equation $$\begin{bmatrix} dzi \\ dr \\ dM \end{bmatrix} = \begin{bmatrix} dzi1 & dzi2 & dzi3 & K & dzN \\ dr1 & dr2 & dr3 & K & drN \\ dM1 & dM2 & dM3 & K & dMN \end{bmatrix} \begin{bmatrix} I1 \\ I2 \\ I3 \\ M \\ IN \end{bmatrix}$$

wherein the target correction amounts for focal-point position, image rotation, and magnification are denoted by dzi, dr, and dM, respectively, an optical axis of the projection system is represented by a z-axis, an orthogonal coordinate system on a plane perpendicular to the z-axis is represented by an x-axis and a y-axis, a complex coordinate of a point (x, y) on an xy-plane is represented by x+iy, the complex conjugate of x+iy is represented by x−iy, the derivative of an arbitrary complexvalued function w[z] with respect to z is represented by w'[z], the z-coordinate of an object point is represented by zo, the z-coordinate of an image point is represented by zi, the on-axis magnetic field of the projection system under uncorrected imaging conditions is represented by B[z], the on-axis electric-potential distribution is represented by $\Phi[z]$, complex coordinates w[z] and wb[z] represent two paraxial orbits and are determined so that wa[zo]=0, wa'[zo]=1, and wb[zo]=1, Re(wb'[zo])=0, Im(wb'[zo])=(0.5(e/2 m)$^{0.5}$)·(B[zo]/$\Phi$[zo]$^{0.5}$), where Re(w) represents the real part of a complex number w, and Im(w) represents the imaginary part of a complex number w, the complex conjugate coordinate of the complex coordinate wa[z] is denoted by wac[z], and the amount of change in the on-axis magnetic field distribution when the nth (for n=1 through N) electromagnetic lens excited by the unit Ampere-turn is denoted by dbn[z].

4. The method of claim 3, wherein when only the focal-point position of the projection system is corrected without changing the image rotation or the magnification of the projection system, the Ampere-turns I1, I2, and I3 of the three electromagnetic lenses are set so as to satisfy the following equation $$\begin{bmatrix} dzi \\ 0 \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix}.$$

5. The method of claim 3, wherein when only the image rotation the projection system is corrected without changing the focal point position or the magnification of the projection system, the Ampere-turns I1, I2, and I3 of the three electromagnetic lenses are set so as to satisfy the following equation $$\begin{bmatrix} 0 \\ dr \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix}.$$

6. The method of claim 3, wherein when only the magnification of the projection system is corrected without changing the focal-point position or the image rotation of the projection system, the Ampere-turns I1, I2, and I3 of the three electromagnetic lenses are set so as to satisfy the following equation:

$$\begin{bmatrix} 0 \\ 0 \\ dM \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix}.$$

7. The method of claim 1, wherein each of the at least three correction lenses changes at least focal point position, imaging rotation, and magnification.

8. The method of claim 1, wherein the at least three imaging characteristics include magnification of the projection system.

9. A charged-particle-beam image-transfer apparatus for guiding a charged particle beam through a projection system onto a substrate coated with resist, the apparatus comprising:

(a) at least three correction lenses, each of which receives a driving current, and each of which changes at least three imaging characteristics of the projection system in response to changes in the driving current; and (b) a control system for determining and setting the driving current for each of the at least three correction lenses such that the at least three imaging characteristics of the projection system are corrected simultaneously.

10. The apparatus of claim 9, wherein the number N of correction lenses is equal to the number M of imaging characteristics.

11. The apparatus of claim 9, wherein the at least three imaging characteristics include focal-point position, image rotation, and magnification.

12. The apparatus of claim 11, wherein the control system sets the driving currents of the at least three correction lenses based on the amount of change produced for each of the at least three imaging characteristics per unit driving current for each of the correction lenses and target correction amounts for each of the at least three imaging characteristics.

13. The apparatus of claim 9, wherein the control system sets the driving currents of the at least three correction lenses based on the amount of change produced for each of the at least three imaging characteristics per unit driving current for each of the at least three correction lenses and target correction amounts for each of the at least three imaging characteristics.

14. The apparatus of claim 9, wherein the number N of the at least three correction lenses is greater than or equal to the number M of the at least three imaging characteristics.

15. The apparatus of claim 9, wherein the number N of the at least three correction lenses is 9 and the number M of the at least three imaging characteristics is 3, and wherein the correction lenses comprise three sets of 3 lenses each, each set being controlled by the control system to correct one of the at least three imaging characteristics without substantially affecting the other two imaging characteristics.

16. The apparatus of claim 15, wherein the at least three imaging characteristics include focal-point position, image rotation, and magnification.

17. The apparatus of claim 9, wherein the at least three correction lenses comprise only lenses that are supplied with a driving current only when a corresponding correction to the at least three imaging characteristics of the projection system is required.

18. The apparatus of claim 9, wherein the at least three correction lenses comprise at least one lens that is supplied with a driving current even when no correction to the at least three imaging characteristics of the projection system is required.

19. A method of correcting each of M imaging characteristics of a projection system of a charged-particle-beam image-transfer apparatus to within respective desired ranges, where M is an integer greater than 1, the method comprising:

(a) providing at least three correction lenses in the projection system each with individually adjustable driving currents;

(b) individually changing a selected imaging characteristic of the M imaging characteristics by changing the driving currents of the at least three correction lenses so as to correct the selected characteristic while leaving remaining imaging characteristics substantially unchanged; and (c) repeating step (b) while varying the selected imaging characteristic among the M imaging characteristics until each of the M imaging characteristics is brought to within its respective desired range.

20. The method of claim 19, wherein the number of correction lenses provided is equal to M.

21. The method of claim 19, wherein the M imaging characteristics include at least focal point position, imaging rotation, and magnification.

* * * * *

UNITED STATES PATENT AND TRADEMARK OFFICE
CERTIFICATE OF CORRECTION

PATENT NO. : 6,008,498
DATED : December 28, 1999
INVENTOR(S) : Hiroyasu Simizu

It is certified that error appears in the above-identified patent and that said Letters Patent is hereby corrected as shown below:

Column 4,
Lines 51-53, equation (1) should read as follows:

$$-- \; dzin = - \frac{e \cdot wb[zi]}{4 \cdot m \cdot wa'[zi] \cdot \sqrt{\Phi[zo]}} \int_{zo}^{zi} \frac{B[z] \cdot dbn[z] \cdot wa[z] \cdot wac[z]}{\sqrt{\Phi[z]}} dz \quad (1) \; --$$

Line 66, an ellipsis -- ... -- should be added after "I3," and before "IN".

Column 5,
Lines 56-58, equation (6) should read as follows:

$$-- \begin{bmatrix} 0 \\ dr \\ 0 \end{bmatrix} = \begin{bmatrix} dzi1 & dzi2 & dzi3 \\ dr1 & dr2 & dr3 \\ dM1 & dM2 & dM3 \end{bmatrix} \begin{bmatrix} I1 \\ I2 \\ I3 \end{bmatrix} \quad (6) \; --$$

Column 7,
Line 33, "Azi" should be -- $\Delta zi$ --.
Line 34, "Ar" should be -- $\Delta r$ --.
Line 35, "AM" should be -- $\Delta M$ --.

Column 10,
Line 16, a comma -- , -- should be inserted after "(dzi)(I1$_o$)".

Column 13,
Line 1, equation (6) should read as follows:

$$-- \; dMmn = - \frac{e}{4 \cdot m \cdot \sqrt{\Phi[zo]}} \int_{zo}^{zi} \frac{B[z] \cdot dbmn[z] \cdot wac[z] \cdot wb[z]}{\sqrt{\Phi[z]}} dz \quad (26) \; --$$

UNITED STATES PATENT AND TRADEMARK OFFICE
CERTIFICATE OF CORRECTION

PATENT NO.  : 6,008,498
DATED       : December 28, 1999
INVENTOR(S) : Hiroyasu Simizu It is certified that error appears in the above-identified patent and that said Letters Patent is hereby corrected as shown below:

Column 15,
Line 55, "complexvalued" should be -- complex-valued --.
Line 61, "w[z]" should be -- wa[z] --.

Signed and Sealed this

Fifth Day of November, 2002

Attest:

Attesting Officer

JAMES E. ROGAN
Director of the United States Patent and Trademark Office